US010712391B2

(12) United States Patent
Choi et al.

(10) Patent No.: US 10,712,391 B2
(45) Date of Patent: Jul. 14, 2020

(54) LOCALIZATION, MAPPING AND HAPTIC FEEDBACK FOR INSPECTION OF A CONFINED SPACE IN MACHINERY

(71) Applicant: ABB Schweiz AG, Baden (CH)

(72) Inventors: Sangeun Choi, Simsbury, CT (US); George Q. Zhang, Windsor, CT (US); Thomas A. Fuhlbrigge, Ellington, CT (US); Hetal V. Lakhani, Irving, TX (US); Than Htaik, West Babylon, NY (US); Gregory Penza, Old Field, NY (US); Robert Kodadek, Long Beach, NY (US); William John Eakins, Bloomfield, CT (US); Gregory F. Rossano, Enfield, CT (US)

(73) Assignee: ABB Schweiz AG, Baden (CH)

(*) Notice: Subject to any disclaimer, the term of this patent is extended or adjusted under 35 U.S.C. 154(b) by 245 days.

(21) Appl. No.: 15/805,998

(22) Filed: Nov. 7, 2017

(65) Prior Publication Data
US 2018/0059187 A1 Mar. 1, 2018

Related U.S. Application Data

(63) Continuation of application No. PCT/US2016/020108, filed on Feb. 29, 2016.
(Continued)

(51) Int. Cl.
*G01R 31/34* (2020.01)
*H02K 15/00* (2006.01)
(Continued)

(52) U.S. Cl.
CPC ............ *G01R 31/34* (2013.01); *B25J 13/025* (2013.01); *B25J 13/065* (2013.01); *B62D 55/06* (2013.01);
(Continued)

(58) Field of Classification Search
CPC ....... B25J 13/025; B25J 13/065; B62D 55/06; B62D 57/024; G01C 21/16; G01C 21/20;
(Continued)

(56) References Cited

U.S. PATENT DOCUMENTS 5,020,234 A * 6/1991 Alkire ...................... G01B 7/14
33/656
5,350,033 A 9/1994 Kraft
(Continued)

FOREIGN PATENT DOCUMENTS

EP 0415042 A2 3/1991
EP 0684483 A2 11/1995
(Continued)

OTHER PUBLICATIONS

Extended European Search Report, European Patent Application No. 16756550.6, dated Oct. 2, 2018, 12 pages.
(Continued)

*Primary Examiner* — Dale Moyer
(74) *Attorney, Agent, or Firm* — Taft Stettinius & Hollister LLP; J. Bruce Schelkopf

(57) ABSTRACT

A modular device is used to inspect a confined space in a machine. The entire inspection coverage area and corresponding status are mapped so that the inspection location and associated data are graphically visualized. An accelerometer mounted on the device serves as a tilt sensor and also provides data about a collision of the device with the space being inspected or defects therein. The accelerometer data in combination with an odometry system determines the axial position of the device. A gyroscope mounted on the device is used to determine the device heading. The locational information is used to generate an inspection map that provides inspection history, logged data and a reference that are useful in scheduling the next inspection. The output of
(Continued)

the gyroscopes can be used to provide haptic feedback to the device operator to maintain proper device orientation.

32 Claims, 16 Drawing Sheets

Related U.S. Application Data

(60) Provisional application No. 62/121,536, filed on Feb. 27, 2015.

(51) Int. Cl.
*B62D 57/024* (2006.01)
*B25J 13/02* (2006.01)
*B25J 13/06* (2006.01)
*B62D 55/06* (2006.01)
*G01C 21/16* (2006.01)
*G01C 21/20* (2006.01)
*G08B 6/00* (2006.01)

(52) U.S. Cl.
CPC .......... *B62D 57/024* (2013.01); *G01C 21/16* (2013.01); *G01C 21/20* (2013.01); *G08B 6/00* (2013.01); *H02K 15/00* (2013.01); *Y10S 901/44* (2013.01)

(58) Field of Classification Search
CPC .......... G01R 31/34; G05B 6/00; H02K 15/00; Y10S 901/44
See application file for complete search history.

(56) References Cited

U.S. PATENT DOCUMENTS

| | | | |
|---|---|---|---|
| 5,650,579 A | 7/1997 | Hatley et al. | |
| 5,677,836 A | 10/1997 | Bauer | |
| 6,087,830 A | 7/2000 | Brandly et al. | |
| 6,104,970 A | 8/2000 | Schmidt, Jr. et al. | |
| 7,076,335 B2 | 7/2006 | Seemann | |
| 7,126,303 B2 | 10/2006 | Farritor et al. | |
| 7,182,025 B2 | 2/2007 | Ghorbel et al. | |
| 7,201,055 B1 | 4/2007 | Bagley et al. | |
| 7,496,459 B2 | 2/2009 | McAllister et al. | |
| 7,555,966 B2 | 7/2009 | Bagley et al. | |
| 7,681,452 B2 | 3/2010 | Bagley et al. | |
| 7,866,421 B2 | 1/2011 | Moore et al. | |
| 8,571,711 B2 | 10/2013 | Jacobsen et al. | |
| 8,789,432 B2 | 7/2014 | Wiesendanger et al. | |
| D748,053 S | 1/2016 | Herrlich et al. | |
| 2003/0229420 A1 | 12/2003 | Buckingham et al. | |
| 2004/0020002 A1 | 2/2004 | Moore et al. | |
| 2004/0020218 A1 | 2/2004 | Alford | |
| 2004/0020219 A1 | 2/2004 | Moore et al. | |
| 2006/0209019 A1 | 9/2006 | Hu | |
| 2007/0089544 A1* | 4/2007 | Bagley .................. G01R 31/34 73/865.8 |
| 2008/0281468 A1 | 11/2008 | Jacobsen et al. | |
| 2009/0194346 A1* | 8/2009 | Moore ............... H02K 15/0018 180/9.42 |
| 2009/0301168 A1* | 12/2009 | Moore .................... G01M 7/08 73/12.09 |
| 2009/0322496 A1 | 12/2009 | da Costa | |
| 2011/0175641 A1* | 7/2011 | Wiesendanger ..... B62D 57/024 324/765.01 |
| 2011/0184661 A1* | 7/2011 | Reed ....................... G01B 11/14 702/34 |
| 2012/0215348 A1 | 8/2012 | Skrinde | |
| 2012/0294696 A1 | 11/2012 | Summer et al. | |
| 2014/0005933 A1 | 1/2014 | Fong et al. | |
| 2014/0156073 A1 | 6/2014 | Zhang et al. | |
| 2014/0182373 A1 | 7/2014 | Sbihli et al. | |
| 2015/0233787 A1 | 8/2015 | Eakins et al. | |
| 2016/0131595 A1* | 5/2016 | Miasnikov ............. G01N 21/94 |

FOREIGN PATENT DOCUMENTS

| | | |
|---|---|---|
| EP | 1373783 B1 | 8/2005 |
| EP | 1772949 A1 | 4/2007 |
| EP | 2071343 A1 | 6/2009 |
| EP | 2096738 A1 | 9/2009 |
| WO | 2015095543 A1 | 6/2015 |

OTHER PUBLICATIONS

Patent Cooperation Treaty, International Search Report and Written Opinion cited in counterpart International Application No. PCT/US16/20108 filed Feb. 29, 2016 (16 pages).
Extepa Brouchure RM Core (40 pages).
GE Energy Brouchure Generator In-Situ Inspections (GER-3954C) (16 pages).
General Electric Company (2014) GE Power & Water Power Generation Services—Fact Sheet—Generator In-Situ Inspections (GER-3954C) (2 pages).
Iris Power Brouchure Itris Power EL CID Evolution (Ver 5—11/13) (4 pages).

* cited by examiner

LOCALIZATION, MAPPING AND HAPTIC FEEDBACK FOR INSPECTION OF A CONFINED SPACE IN MACHINERY

CROSS REFERENCE TO RELATED APPLICATIONS

This application claims the benefit of U.S. Provisional Application No. 62/121,536, filed Feb. 27, 2015, which is incorporated herein by reference in its entirety.

TECHNICAL FIELD

The present invention generally relates to an apparatus and system including haptic feedback for inspection of machinery and more particularly, but not exclusively to a system with haptic feedback for inspection and mapping of an air gap region of an electrical machine.

BACKGROUND

Devices known as crawlers or miniature robot devices can be used to perform some tasks such as air gap inspection and wedge tapping without removal of the rotor in some types of electrical machines. In some applications disassembling the machine prior to inspection is difficult or unpractical from a cost or system complexity standpoint. Some existing inspection systems have various shortcomings relative to certain applications. Accordingly, there remains a need for further contributions in this area of technology.

SUMMARY

One embodiment of the present disclosure includes apparatus and system with haptic feedback and mapping capabilities for inspection of machinery. Other embodiments include apparatuses, systems, devices, hardware, methods, and combinations of systems with haptic feedback for inspection of machinery with unique methods and apparatus are disclosed herein. Further embodiments, forms, features, aspects, benefits, and advantages of the present application shall become apparent from the description and figures provided herewith.

DETAILED DESCRIPTION OF THE ILLUSTRATIVE EMBODIMENTS

A crawler or robot device one embodiment of which is described below is used in operations such as visual inspection, other inspections with various sensors, wedge tapping, stator repair and maintenance such as cleaning inside the air gap between the stator and the rotor of rotating electrical machinery. The machinery can include motors, generators and other rotating machines such as gearless mill drives that have an air gap suitable for crawler movement.

Figure 15A:
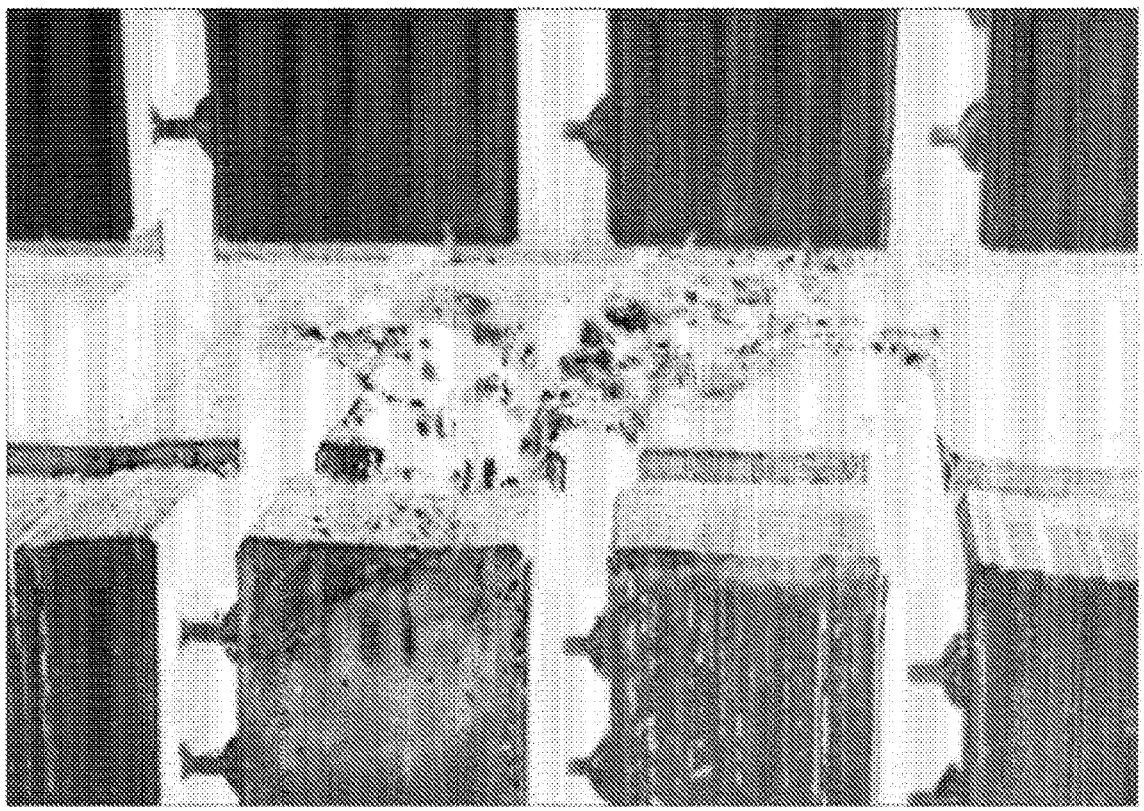
FIGS. 15A and 15B show exemplary defects that may be inspected on a stator and a rotor respectively.
Figure 15B:
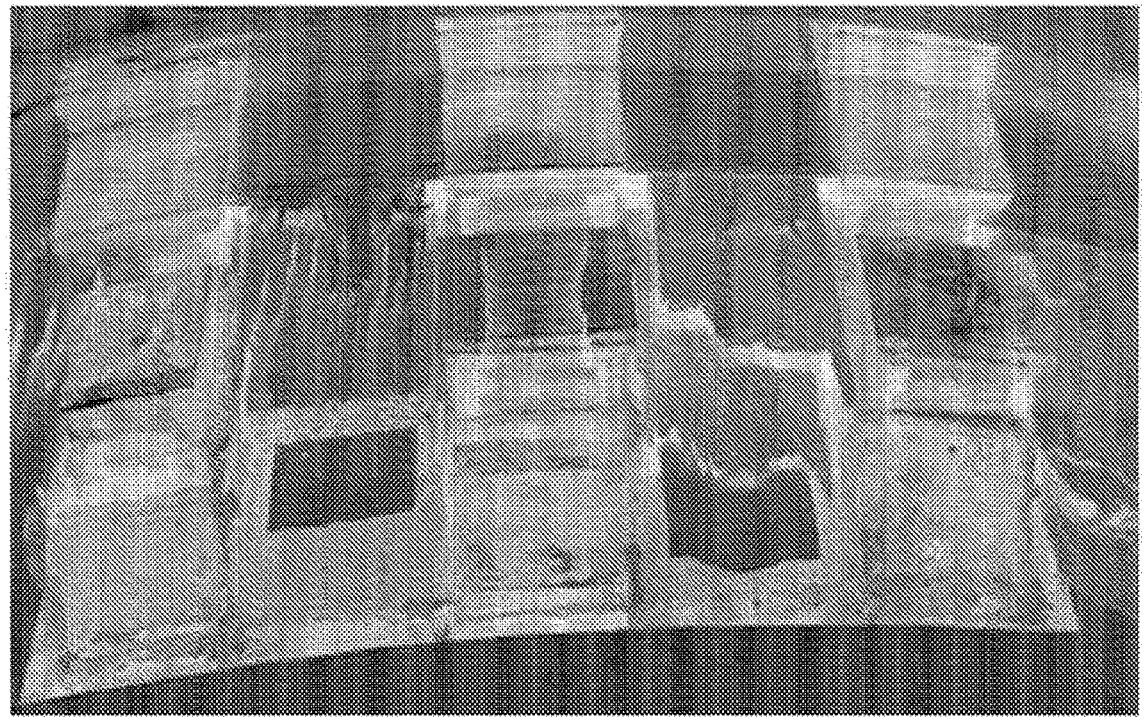

The crawler inspection can find defects on the stator and the rotor. One example of a stator defect is shown in FIG. 15A. This defect was a core fault caused by loose debris moving through the air gap and lodging in the radial core vents of the rotating machine. One example of a rotor defect is shown in FIG. 15B. This defect was caused by cracking of a top tooth in a two pole, 60 Hz, hydrogen cooled generator.

Figure 1:
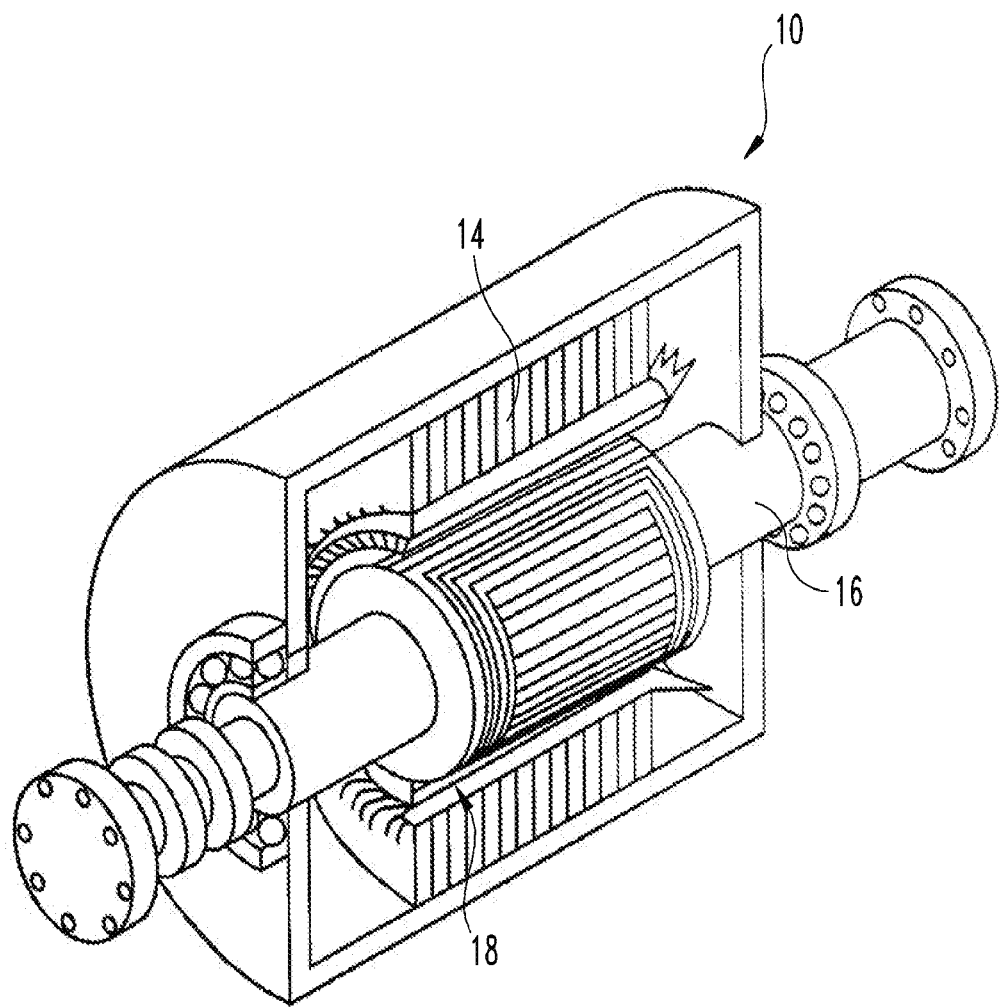
FIG. 1 shows a perspective view partially cutaway of one example of a rotor and stator of a rotating electrical machine in which a crawler can be used.

Referring now to FIG. 1, there is shown a perspective view of one example of a rotor 16 and a stator 14 of a rotating electrical machine 10 partially cutaway in which a crawler or robot device 12 may be used for inspection in a confined space. An exemplary embodiment of the crawler 12 is shown in FIG. 3 and is described below. The rotating machine 10 can be a typical motor/generator with stator 14, rotor 16 and air gap 18. In some configurations, the crawler 12 may crawl on the teeth 14a shown in FIG. 2A of stator 14.

Figure 2A:
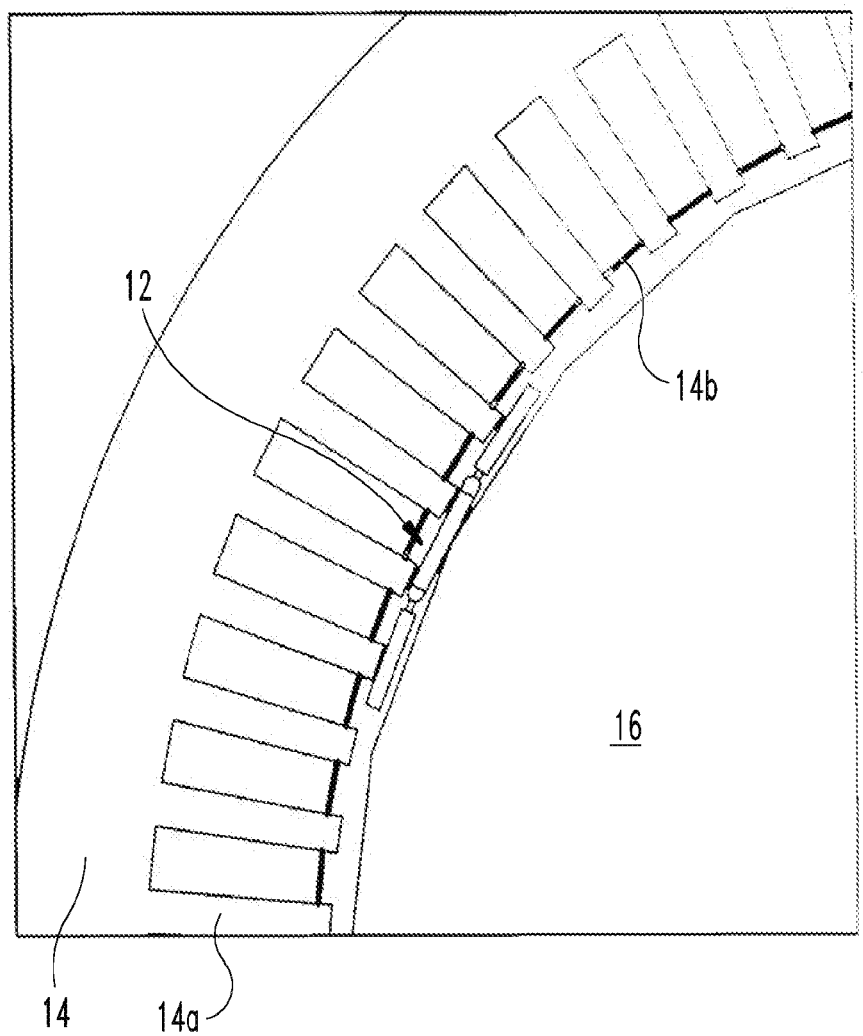
FIG. 2A illustrates a portion of an electrical machine with the stator in place and a robot crawler positioned on the teeth of the stator of the machine.
Figure 2B:
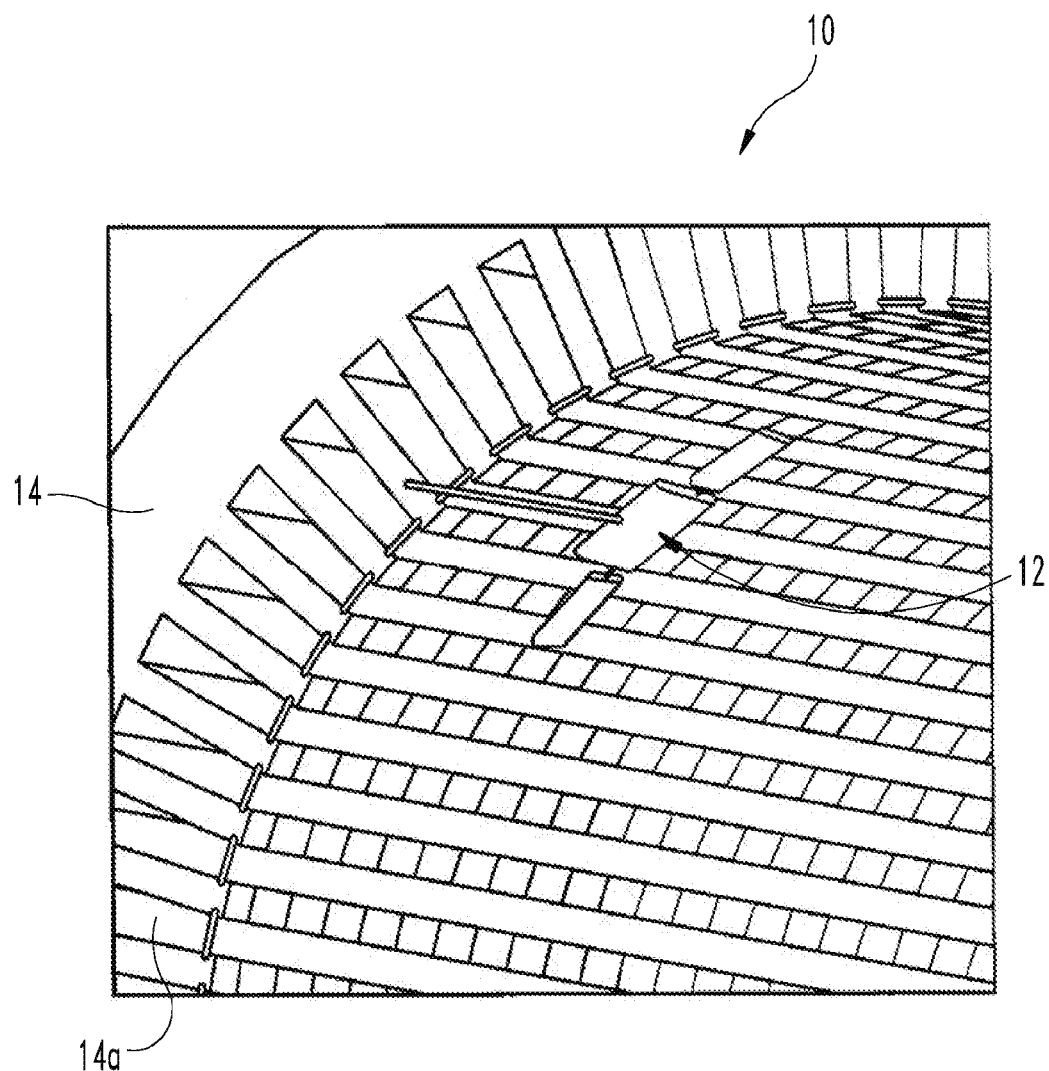
FIG. 2B shows a crawler positioned on the stator teeth without the rotor in place.
Figure 3:
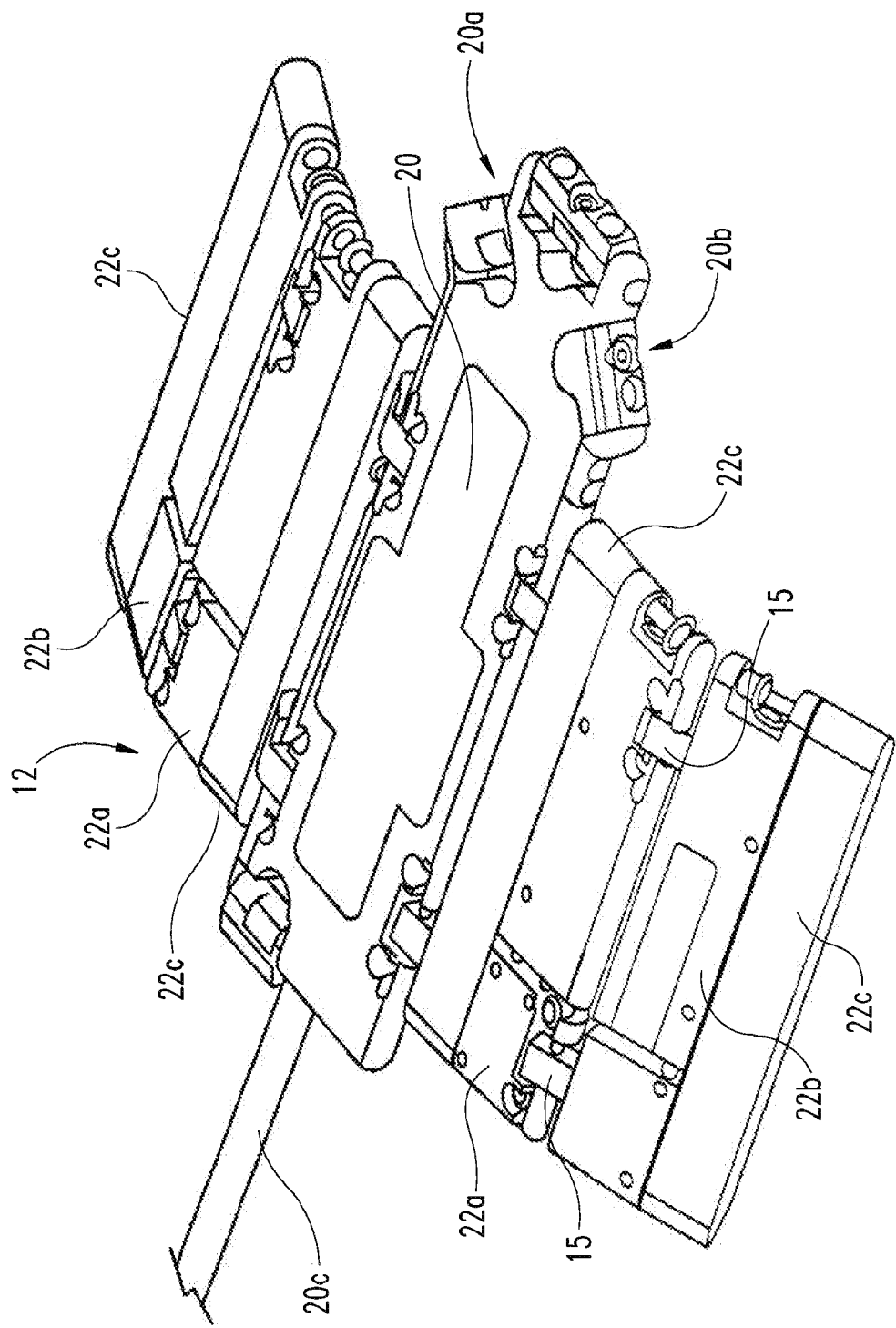
FIG. 3 shows an exemplary embodiment of a crawler.

FIG. 2A illustrates a robot crawler 12 crawling on the teeth 14a of stator 14 with the rotor 16 in place. The teeth 14a are typically laminated steel or another ferromagnetic material. As is well known, the teeth 14a can be of different configurations of slot dimensions and shapes. FIG. 2B shows the crawler 12 crawling on the stator teeth 14a without the rotor 16 in place. For ease of illustration the copper coils in machine 10 are not shown in FIGS. 2A and 2B.

FIG. 3 shows an exemplary embodiment for a modular crawler 12. The crawler 12 can include a tethered function main module 20 and a combination of inner and outer track-drive modules 22a and 22b on each longitudinal side of module 20. A tether 20c allows the crawler 12 to communicate with a base station (not shown) that is outside of machine 10. Crawler 12 can also perform its functions without the tether 20c, i.e. through radio frequency, Wi-Fi or other wireless communication/control methods. As shown in FIG. 3, each of the drive modules 22a and 22b has a belt drive 22c. While not shown in FIG. 3 each track-drive module 22a and 22b can include a gear motor for each of the associated belt drives 22c.

Module 20 can include a visual inspection function provided by on board cameras 20a and 20b. One of the modules can also include a camera (not shown in FIG. 3) on the side facing the rotor 16 when the crawler 12 is positioned in the electrical machine 10.

Referring back to FIGS. 2A and 2B, the crawler 12 is operable for crawling across and engaging with the stator teeth 14a by magnetic attachment means. One or more magnets (not shown) can be positioned on each of the drive modules 22a and 22b so as to provide sufficient force to keep the crawler attached to the machine. The crawler 12 is operable when the rotor 16 is installed in machine 10 and also when the rotor 16 is removed from machine 10.

However, in some embodiments, only the stator teeth 14a, which the belt track 22c of each of drive modules 22a and 22b ride on, are made of ferric material, the tracks 22c have to be aligned, or at least substantially aligned, with the stator teeth 14a when attached via magnet force. In other embodiments, other attachment means may be employed such as for example a plurality of suction cups adapted to extend from one or more belts 22c. Since the teeth dimension and the width ratio between the tooth 14a and wedge 14b shown in cross section in FIG. 2A vary across different machines, the tracks 22c can be adjusted to match the tooth configuration for a specific machine. As is known by the skilled artisan, wedges 14b hold the copper coils in machine 10 and the crawler 12 may include means for tapping or otherwise inspecting the wedges 14b during maintenance operations.

Figure 4C:
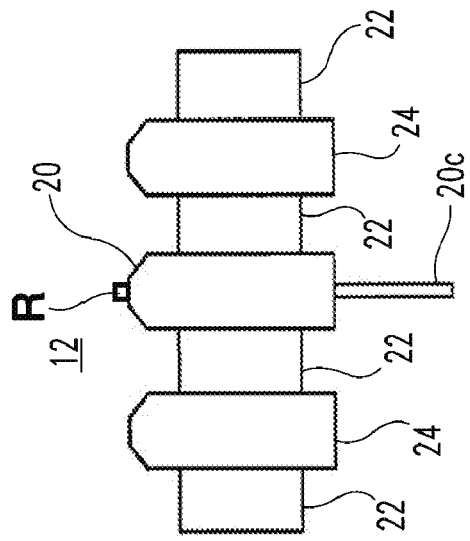
FIGS. 4A, 4B and 4C illustrate extendable modular designs for a crawler.
Figure 4B:
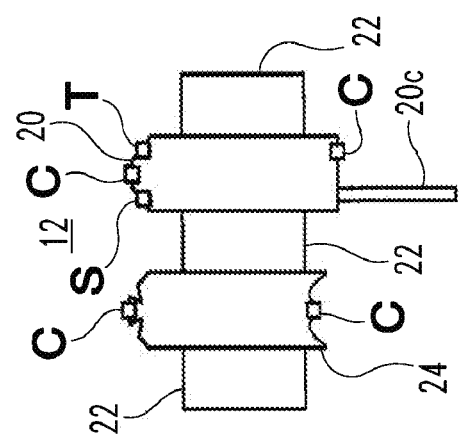
Figure 4A:
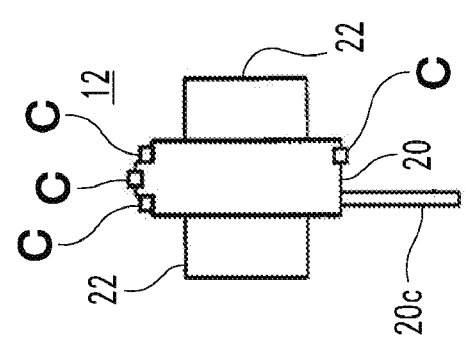

FIGS. 4A, 4B and 4C illustrate an extendable modular design for crawler 12. As shown in FIG. 4A, crawler 12 can have one tethered function module 20 and one drive module 22 that can either be 22a or 22b or the combination thereof on each side of module 20. Thus FIG. 4A shows in schematic form the embodiment for the crawler 12 shown in FIG. 3.

As shown in FIG. 4B, crawler 12 can have a tethered function module 20 having a drive module 22 connected to each side of module 20, and a function module 24 connected to a distal side of one of the drive modules 22. An additional drive module 22 can be connected to the left side of module 24.

As shown in FIG. 4C, the modular crawler 12 can have multiple functional modules 24 and multiple drive modules 22. There can be no limit to the number of modules 22 and 24. However, a predetermined number of modules 22 and 24 are used to achieve the desired functions for a given application.

As shown in FIG. 4B, the tether 20c of function module 20 does not have to be in the center of the crawler 12 as shown in FIGS. 3 and 4A. The squares shapes labeled "C" on the function modules 20 and 24 in FIGS. 4A-4C each represent a camera. In some embodiments one of the function modules can include a wedge tapper "T" or other type of sensor "S". In other embodiments a repair module "R" (see FIG. 4C) may be included to repair the machine. By way of example and not limitation the repair module may include grinding tools, cutting tools, welding tools, epoxy or other adhesive applying tools, and/or debris removal tools, etc.

As can be appreciated the drive modules 22 shown in block form in FIG. 4A, 4B or 4C can be only one of modules 22a or 22b attached to each longitudinal side of tethered module 20 or non-tethered module 24. The linking between each of the modules 22 and 24 and the associated drive modules 22a or 22b can be accomplished by use of hinged spacers 15 one example of which is shown in FIG. 3 with either fixed or adjustable linkages.

In one form, the crawler 12 can perform one or more tasks such as visual inspection, measurement and repair. The crawler 12 may map the entire inspection coverage area and create a corresponding status or location status indicators in a manner that allows the inspection location and corresponding inspection data to be graphically visualized in real time or via recorded memory. As can be appreciated, localization and mapping of the air gap 18 is difficult due to its very small height (in one non-limiting example 10 mm) and long length in one non-limiting example (2 to 5 meters). In some embodiments removing the rotor to reduce challenges of small gap inspection is undesirable due to cost, time and risk of damaging the equipment.

Figure 6:
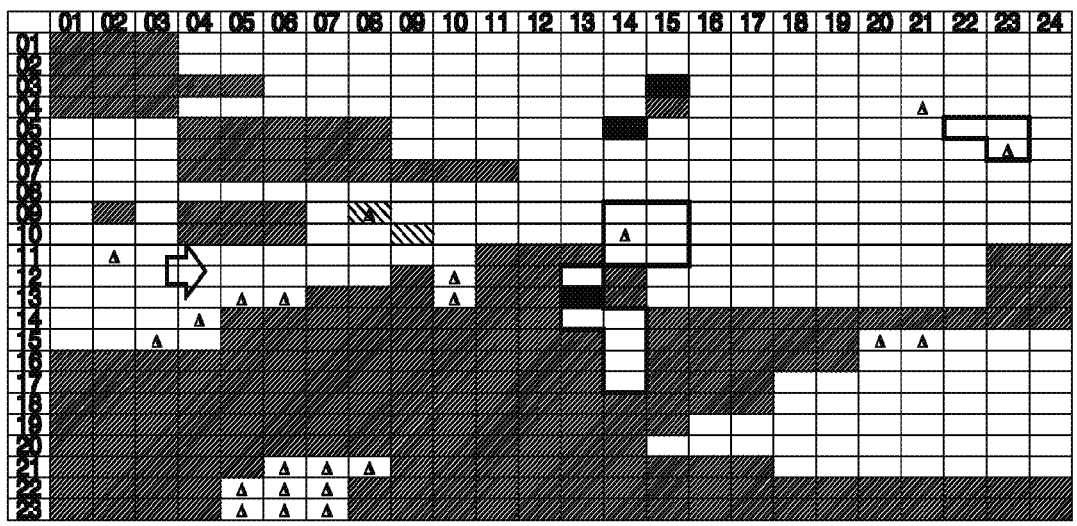
FIG. 6 shows an example of a status map in the form of a 2D array of a space shown below as inspected by the crawler.
Figure 6:
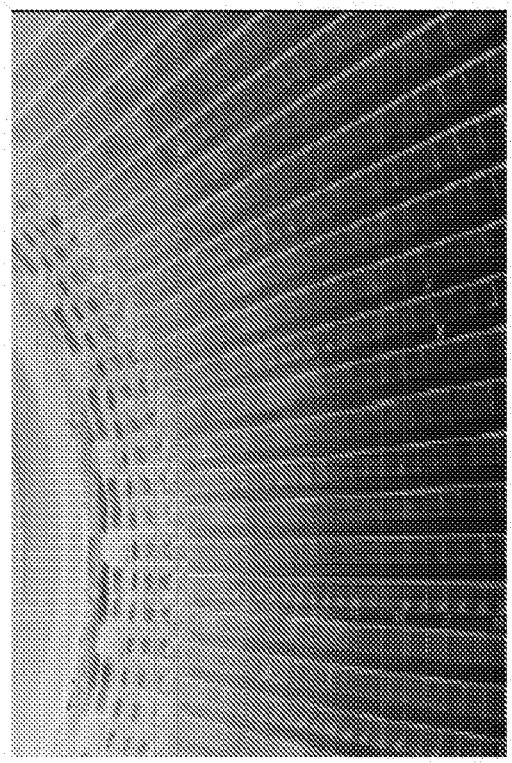
Figure 6:

One aspect of the present disclosure includes means for spatial data mapping of the inspection space. An exemplary form includes a 2D-array mapping chart 60 and is depicted in FIG. 6. This mapping data can be used for manual or auto navigation routing and planning. A micro-machined accelerometer-based tilt sensor mounted on each side of crawler tracks can be used to detect location and estimate the size of a surface irregularity.

Air gap inspection may be conducted on a regular or on an as needed basis. In one form a sensor for inspection can include a video camera mounted on the crawler 12. In the exemplary embodiment, cameras 20a and 20b shown in FIG. 3 may be used to transmit live images to a monitor and/or a memory recording device. In operation the one or more cameras may transmit a real-time live image to the operator so that he/she can maneuver the crawler 12 and also visually inspect the structure for defects or foreign object debris.

In one aspect, it can be desirable to inspect machine structure adjacent to the air gap in a systematic manner. Systematic inspection can include inspecting portions of or inspecting the entire coverage area and corresponding status results may be mapped in such a way that the inspection location and corresponding inspection data is graphically displayed. Such a mapping task requires identification of inspection locations (or addresses) and acquisition of inspection data/results. The inspection location can be in the form of a predefined grid pattern. The grid pattern can define an array (for example [121, 23]) because the entire air gap area can be discretized by "teeth". The inspection data can include images files, surface condition (e.g. height in case of a bump, depth in case of a recessed dimple), pass/fail index, etc.

Figure 5:
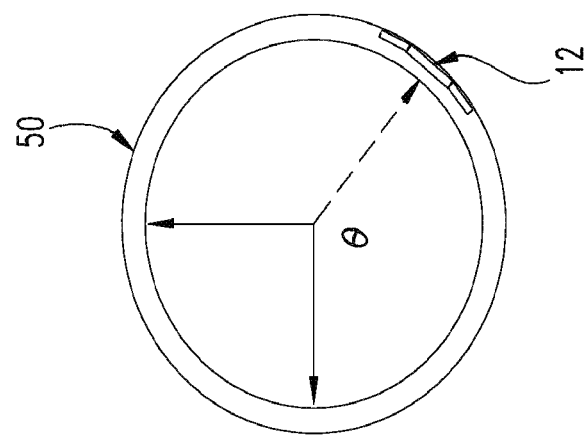
FIG. 5 shows an exemplary cylindrical space inspected by the crawler.
Figure 5:
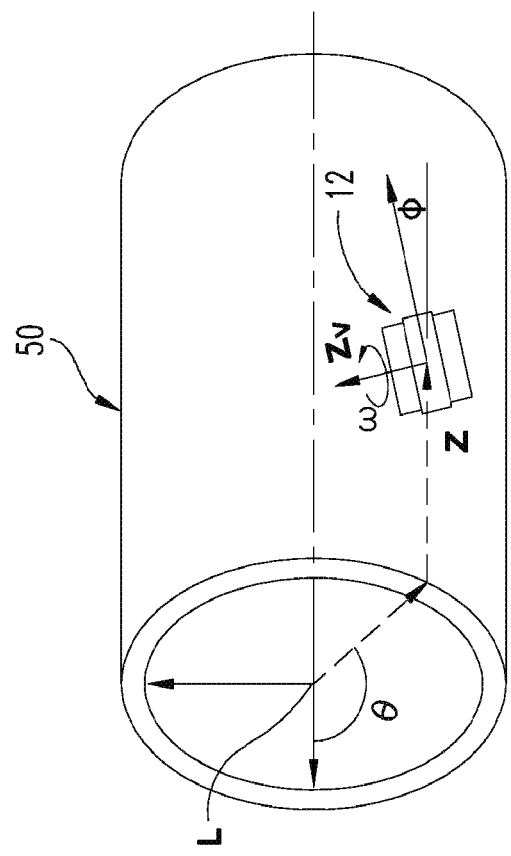

As shown in FIG. 5, an exemplary inspection space is can be defined by way of example and without limitation as a cylindrical shell 50 between the rotor and the stator of the rotating machine. The position of the inspection vehicle, that is, crawler 12 shown in schematic form in FIG. 5 can for example and without limitation be defined as angular position $\theta$, axial position z, and heading angle $\phi$ relative to a fixed or known location "L".

Identifying inspection location invokes techniques for solution of the localization problem typical to mobile robots. SLAM (Simultaneous Localization and Mapping) is one example of a method to build up a map within an unknown environment or to update a map within a known environment while at the same time keeping track of the current location of mobile robot(s) (by using odometers, ultrasonic sensors and/or laser scanners, etc.). For a crawler 12, it can be impractical in some applications to have bulky sensor hardware such as 1D-(single beam) or 2D-(sweeping) laser rangefinders, 3D Flash LIDAR cameras, 2D/3D sonar sensors and one or more 2D cameras, as an integral part of the system due to the size limitations.

A micro-machined accelerometer can be designed to sensitively respond to the earth's gravitational field in static application or acceleration when subjected to motion in dynamic application, or both. An accelerometer, mounted on the crawler 12, can serve as a tilt sensor for detecting current angular position for portions of the crawler 12.

In one aspect, the axial position Z (FIG. 5) can be determined by an odometry system enabled by encoders integrated in the gear motors included in the track-drive modules 22a and 22b. In one exemplary form, four encoders each of which may be integrated into track-drive module motors to continuously measure the gear motor rotation. The signal content from the four encoders can be translated into the travel distance and direction of the vehicle. Also, in some embodiments one or more accelerometers can be used for calculating axial position of the vehicle 12. In some embodiments, the raw noisy acceleration signal transmitted directly from the sensor may be conditioned and/or filtered to eliminate/compensate for the noise (both mechanical and electrical) and inherent sensor drift. The odometry system in combination with one or more accelerometers may be utilized to keep track of the position of the vehicle 12. Other techniques for obtaining position from accelerometer data may also be used as one skilled in the art would understand.

The position information of the vehicle in the inspection area can also include the "heading" (denoted by $\phi$ in FIG. 5) of the vehicle 12. A gyroscope can be mounted on the vehicle 12 in such a way that it detects the vehicle's angular rotational speed (denoted by $\omega$ in FIG. 5) about the vertical axis (denoted by $z_v$ in FIG. 5) of the local coordinate frame of the vehicle. This angular speed of the vehicle 12 is the rate of the change of the vehicle's heading angle, and therefore gives information of where the vehicle 12 is currently heading when integrated with respect to time.

An IMU (Inertial Measurement Unit) can be used with the crawler 12 in some embodiments. An IMU may include 1 or more accelerometers, gyroscopes and/or magnetometers. The IMU may include built-in signal conditioning circuits and software that measures and transmits the position, velocity, orientation, and tilt angle of the crawler 12 continuously or at discreet time intervals.

With the location information of the vehicle 12 and corresponding inspection data, an inspection map 60 sometimes also referred to herein as a status map can be generated as shown in FIG. 6, in an exemplary 2D array format. The location of the teeth 14a and thus the locational map for the teeth 14a is predefined by the specification for the machine 10. The sensors on the inspection vehicle 12 are operable for sensing and transmitting the vehicle data to a computer memory and/or a monitor for the operator to analyze. The operator may view in real time or at a subsequent time data associated with a particular position on a tooth (i.e. i=23, j=356). To that end there can be a "translator" from the sensor data to the location of that tooth on the map. Thus the data shown in the map location for that tooth is a visualization of the recorded status data for that tooth from a camera and any other status determining instrumentation mounted on the inspection vehicle 12.

Figure 7:
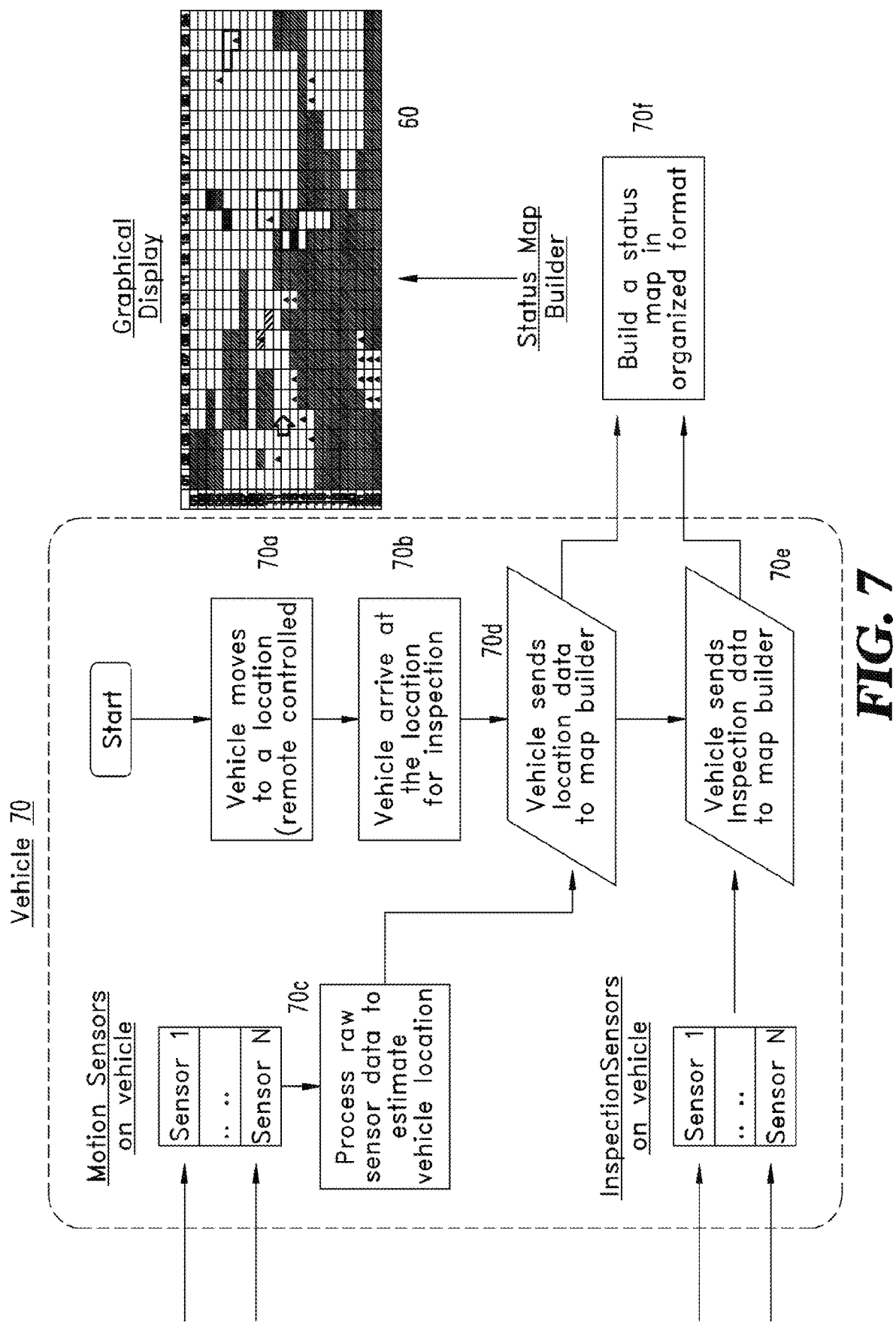
FIG. 7 shows a flowchart illustrating a method for inspection status mapping.

Referring now to FIG. 7, there is shown a flowchart 70 for the above described inspection status mapping method by the various sensors on the vehicle 12. At 70a the operator moves the inspection vehicle 12 to the location in the air gap 18 to be inspected either through computer automation or through manual control. At 70b it is determined from visual guidance from the camera and/or other sensing means that the vehicle 12 has arrived at the desired location for inspection. The vehicle 12 can include one or more motion, orientation and/or location sensors. The raw data from the one or more sensors at 70c can be processed to estimate the location of the vehicle. By way of example, the vehicle may be determined to be at the [i,j]th tooth.

At 70d the vehicle 12 sends the location data to the map builder or mapping system. As shown in the flowchart the vehicle 12 has one or more inspection sensors and the data from those sensors are sent by the vehicle to the map builder. At 70e, the map builder uses the location data and the inspection data to build the status map with status indicators in the predetermined format at 70f. There is shown in this figure for the inspection status mapping flowchart a graphical display of the status map 60 (note status map 60 is also shown in FIG. 6).

One of the tasks required for motor/generator gap inspection is inspection planning and scheduling. The inspection map 60 provides the operator with inspection history, logged data and a reference useful for future inspection plans. The scheduling criteria obtained from the inspection map 60 may include, by way of example, and not limitation: inspection completed location and data; uninspected (or uncovered) location; inspection failed location and information regarding required action; and/or a re-inspection location.

From the information above, the next inspection round can be planned in detail and the vehicle 12 can be configured for the inspection trip by mounting desired sensors and/or repair apparatus thereon. Once an inspection route and task is defined, the vehicle 12 can be operated manually, semi-autonomously or autonomously depending on how the vehicle control system is designed.

Figure 8:
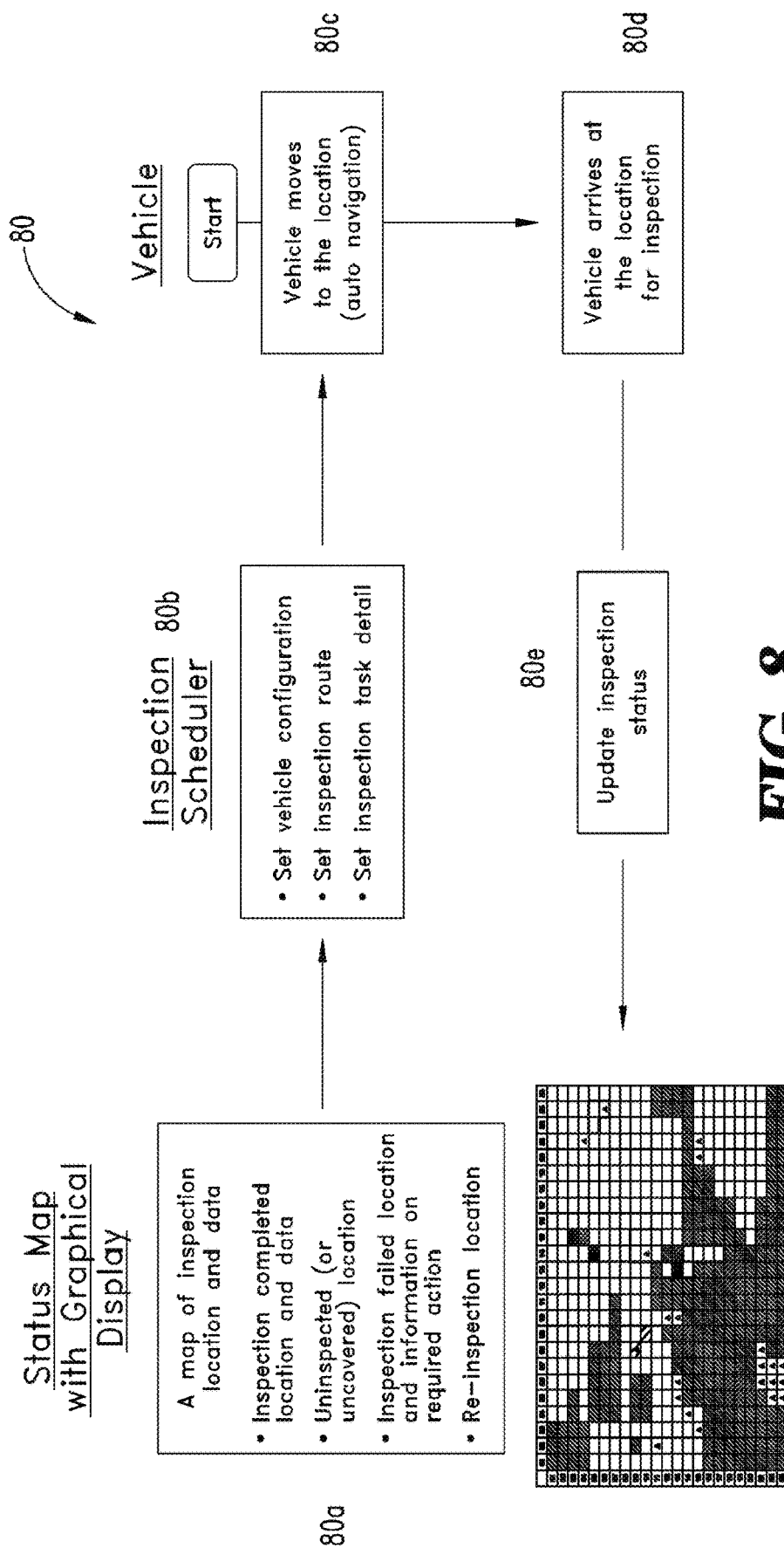
FIG. 8 shows a flowchart illustrating a method for using the inspection map to set the schedule for inspecting a space by the crawler.
Figure 9:
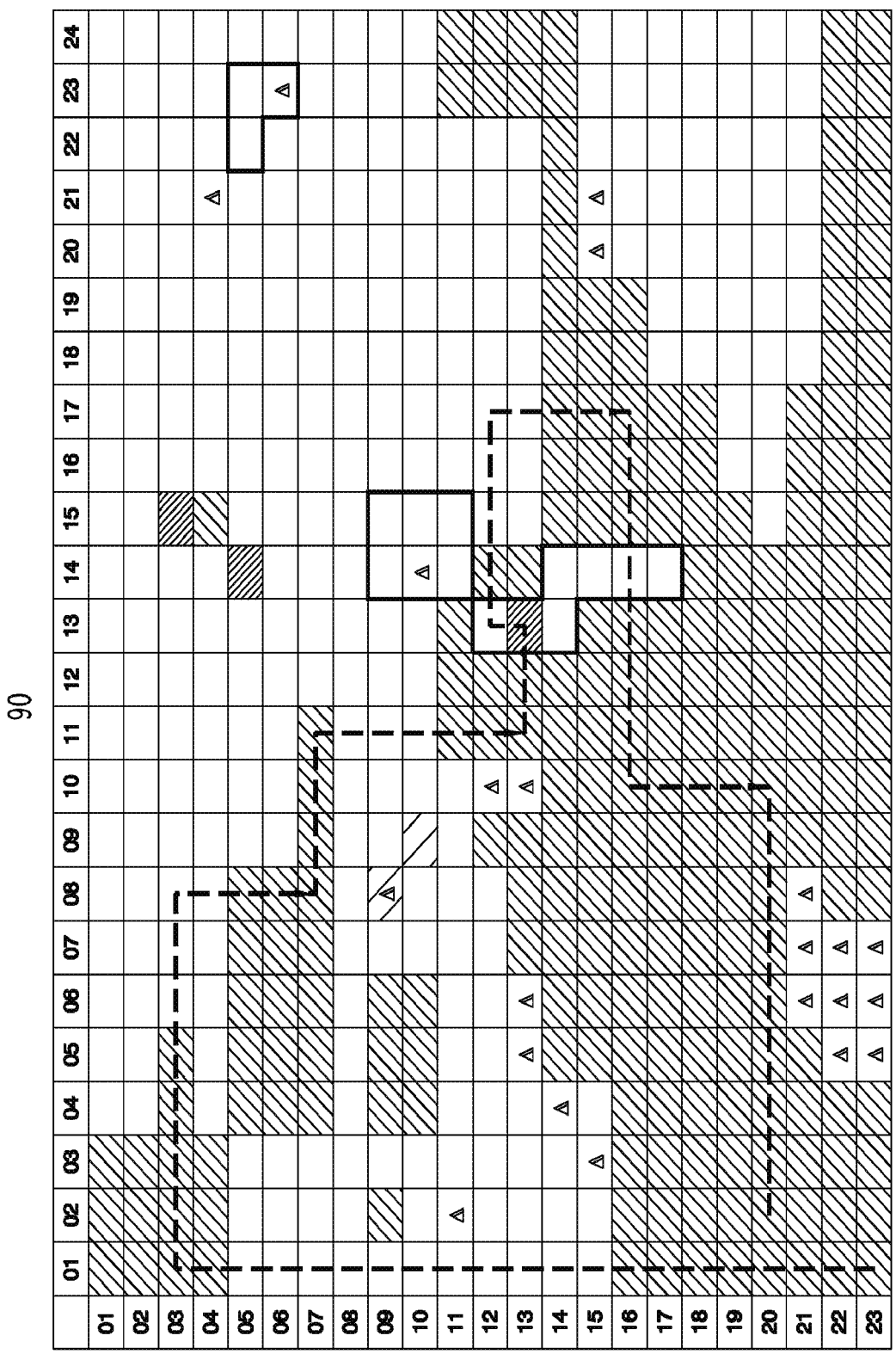
FIG. 9 shows one example of an inspection route in dashed line to be taken by a crawler.

Referring now to FIG. 8, there is shown a flowchart 80 illustrating a method for using the inspection map 60 to set the schedule for inspecting the air gap 18. At 80a there is shown the previously described inspection status map 60 and graphical display that is seen when the vehicle 12 inspects the air gap 18. Information about the status of the inspection can be displayed as desired. For example information regarding which locations were inspected as well as data obtained for those locations may be generated. Additional information may include: any locations not inspected or uncovered locations; any inspection failures for an identified location; information noting required action; and/or whether a re-inspection is required for a particular location. This information can be sent to an inspection scheduler which at 80b sets the vehicle configuration, the inspection route and the inspection task details. An exemplary inspection route 90 is shown as a dashed line in FIG. 9. The scheduler information is transmitted to the vehicle 12 and at 80c the vehicle may move using auto navigation to the inspection location. In other forms the vehicle may be moved through manual navigation or combinations of manual and auto navigation. At 80d the vehicle reports its arrival at the desired location and at 80e the inspection status is updated.

Figure 10:
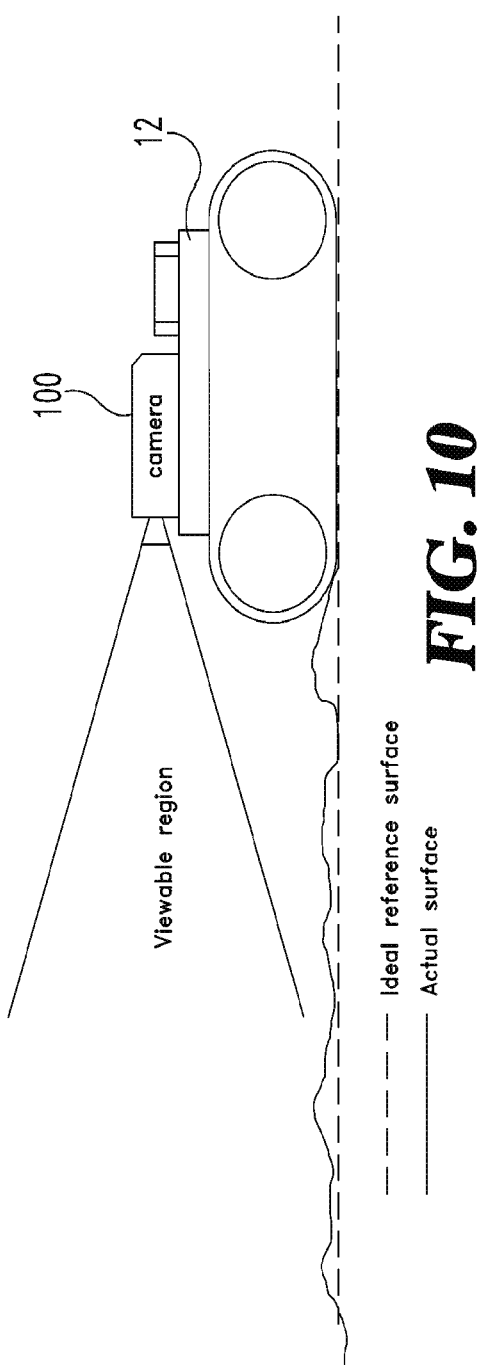
FIG. 10 shows an exemplary video camera mounted on a crawler.
Figure 11:
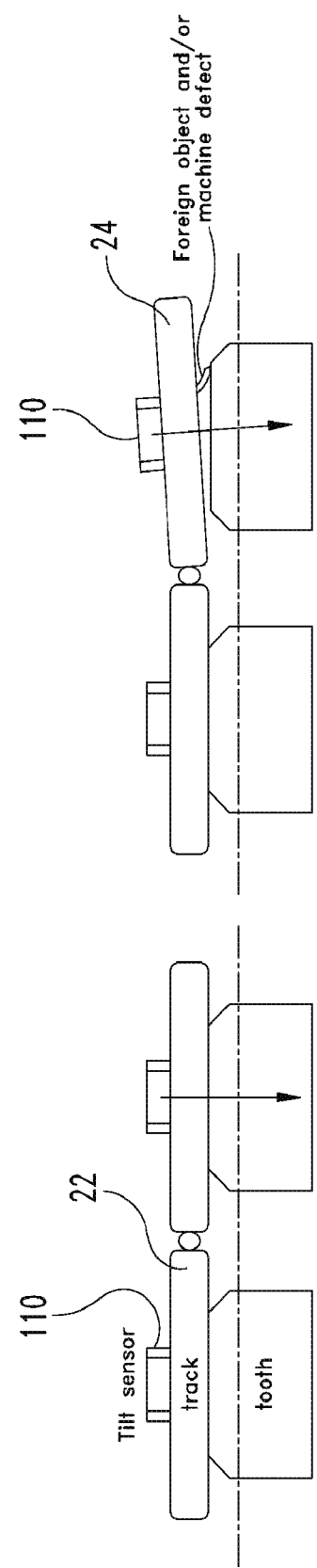
FIG. 11 shows an accelerometer-based tilt sensor mounted on one of the modules of a crawler.

Surface irregularities can be caused by structural flaws in problem components such as delamination, a heat or stressed induced warpage, fatigue cracking, or the like as well as by foreign object or debris finding its way into the gap or path. In some aspects a video camera 100 mounted on crawler 12 as shown in FIG. 10 may not detect and/or identify all of the surface irregularities. To enhance defect detection an accelerometer based tilt sensor 110 mounted on module 22 or 24 as shown in FIG. 11 can be used. The tilt sensor 110 may be operable to detect a surface defect and estimate its size and/or shape in conjunction with the visual display. The ideal (no irregularity) surface of the air gap 18 is defined by design criteria of the component being inspected. Any change whether abrupt or gradual in sensor readings relative to the reference values indicates the existence of defects or structural flaw on the surface. The accelerometer based tilt sensor 110 mounted on the crawler vehicle 12 as shown in FIG. 11 can provide information such as a relative magnitude of the defect or foreign object as well as a direction and intensity of the collision. The defect involved in the collision may be a part of motor structure or undesirable foreign objects located inside the air gap 18.

It should be appreciated that including one or more micro-machined motion sensors and mapping capabilities as described herein on the inspection crawler 12 along with visual inspection provides the crawler operator with an augmented sensing capability to track what has been inspected, to plan what to inspect next, and to integrate surface defect information in the map. This integration of micro sensing technology and mapping software provides inspection and planning information for motor and generator maintenance, without removing the rotor.

In some aspects during manual operation it can be difficult for an air gap crawler operator to maintain the correct orientation of a crawler 12 because the crawler 12 cannot be viewed directly due to the air gap's small size. Also, it is sometimes desirable to allow the operator to reorient the crawler 12, at least to a small degree, in order to allow the operator to change the orientation and/or position of the sensors or other devices on the crawler. In these instances, it may not be desirable to mechanically force the crawler 12 into one orientation, i.e. by use of mechanical guides to lock the crawler into the same orientation as a stator slot.

Figure 12:
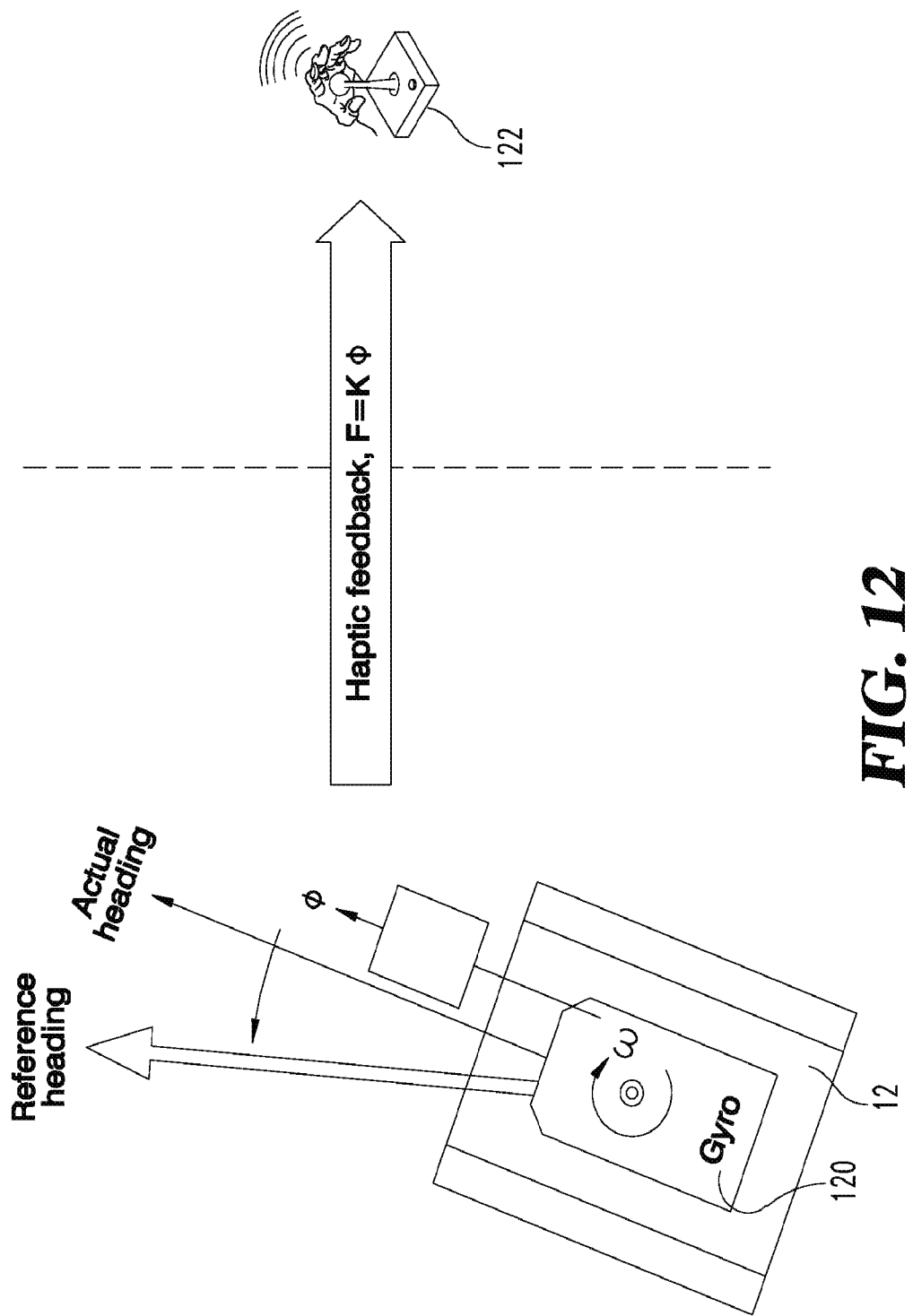
FIG. 12 shows gyroscopes mounted on a crawler to provide the orientation sensed as visual feedback and/or to provide haptic feedback to the operator.

In some forms, haptic feedback can be used to help the crawler operator guide the crawler 12 without mechanically limiting the movement of the crawler 12. Gyroscopes 120 on the crawler 12 as shown in FIG. 12 can provide the orientation of the crawler 12. Knowledge of the stator design can be combined with the gyroscope's readings to calculate the deviation of the crawler 12 from the desired orientation, which is typically the nominal orientation of the stator slot. Haptic feedback can be provided to the operator through a joystick 122 such as by way of example and not limitation the Thrustmaster force feedback enabled joystick available from Guillemot Corporation S.A. to inform the operator of the deviation. The haptic feedback may help the operator to adjust the crawler 12 to a correct orientation at an early stage so that the operator may not have to make greater corrections in orientation at a later time as is shown in FIG. 12 to change the course of the crawler 12. Thresholds and various scaling functions can be used to provide more or less feedback depending on how much the operator is expected to deviate from the nominal orientation. Thresholds and scaling functions can also be tailored to operators' levels of experience and/or preferences. In some forms, haptic feedback can be used to help guide the crawler operation when in manual mode. The operator may be able to keep his/her eyes on the monitor while at the same time being able to completely focus on the inspection task at hand.

In some aspects it can be difficult for an air gap crawler operator to detect small changes in the orientation of the crawler 12 that occur when the crawler drives over an irregular surface. For example if the crawler 12 is composed of many modules linked together by various joints or spacers as shown in FIG. 11, it is possible that a module has changed orientation relative to a desired orientation. In some forms there may be no visual output to the operator and in other forms visual output may be inadequate to help the operator control the crawler 12. Therefore, it may be helpful to alert the operator to changes in the crawler state due to surface irregularities or other causes. Haptic feedback, such as vibration in the crawler joystick 122, can be used to alert the operator to the fact that the crawler 12 has driven over a bumpy surface or part of the crawler 12 has bumped into an obstacle, or that the crawler configuration or orientation has changed beyond a specified threshold. As described above, a surface defect can be detected and the size can be estimated by an accelerometer-base tilt sensor 110, but may not signal to the operator that a crawler module has changed its orientation.

Figure 13:
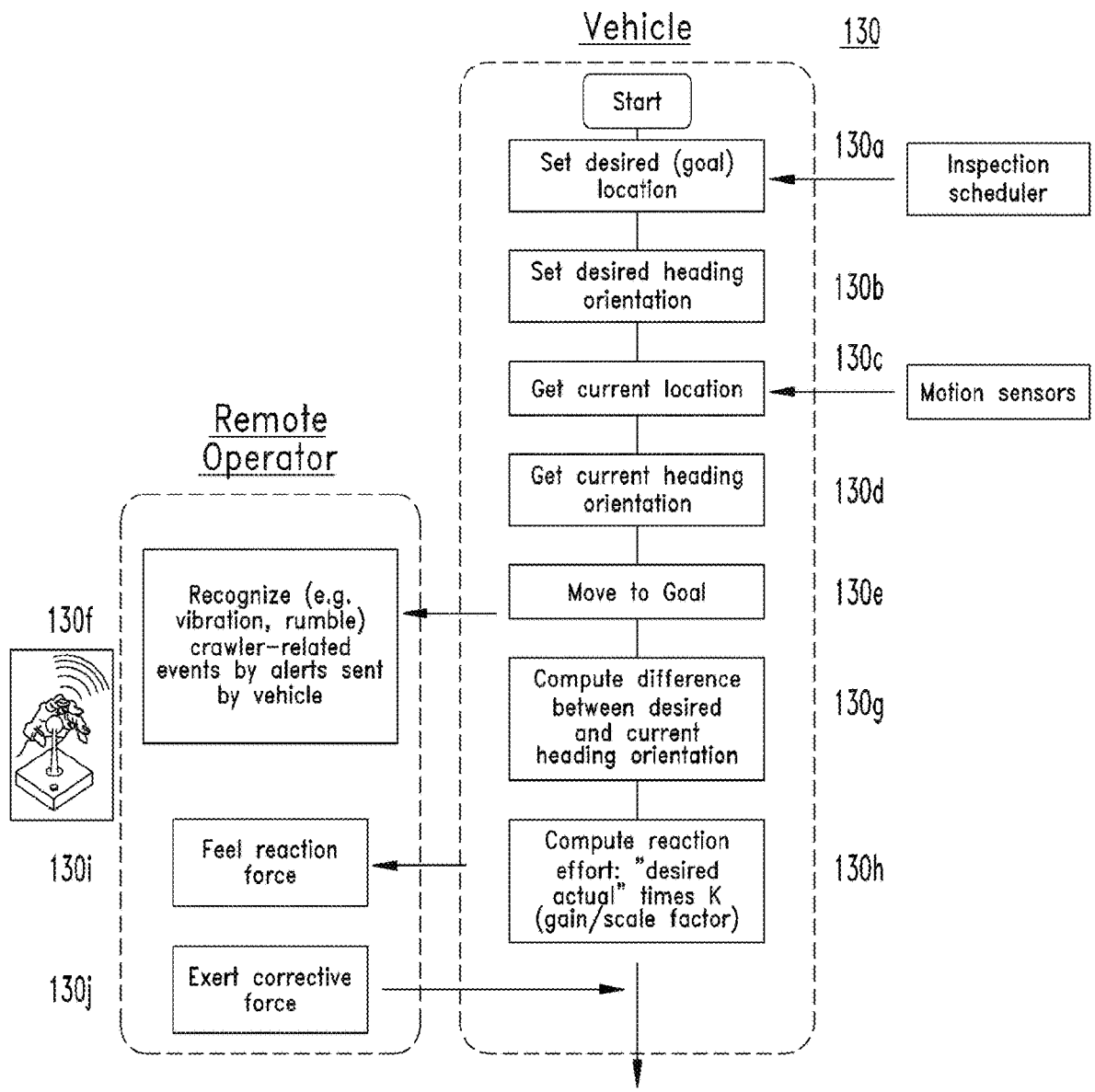
FIG. 13 shows a flowchart illustrating a method for using haptic feedback to assist with orientation of the crawler and for alerting to the operator about inspection related events.

Referring now to FIG. 13, a flowchart 130 includes a method showing how haptic feedback may help the operator maintain proper orientation of the inspection crawler 12 and also how haptic feedback alerts the user to crawler related events such as rumble and vibrations. At 130a the desired location of the inspection crawler 12 is set using the previously described inspection scheduler. The desired heading orientation is then set at 130b. The output of various sensors is used at 130c to obtain the current location of the inspection crawler 12 and the current heading orientation of the inspection crawler 12 at 130d.

The inspection crawler 12 is moved at 130e to where to a goal or desired location at 130e. The moving inspection crawler 12 at 130f sends haptic feedback alerts such as those described above to the operator during movement of the crawler 12. At 130g the difference between the desired and actual heading orientation is computed and at 130h the reaction force is computed as the difference computed at 130g multiplied by a software adjustable gain/scale factor. The reaction factor can be set at an appropriate level to achieve a fast response to the deviation. The computed reaction force is sent to the operator's haptic feedback device 122 and the operator feels the reaction force at 130i. The operator then at 130j uses the haptic feedback device 122 to exert a corrective force to the moving inspection crawler 12.

Figure 14:
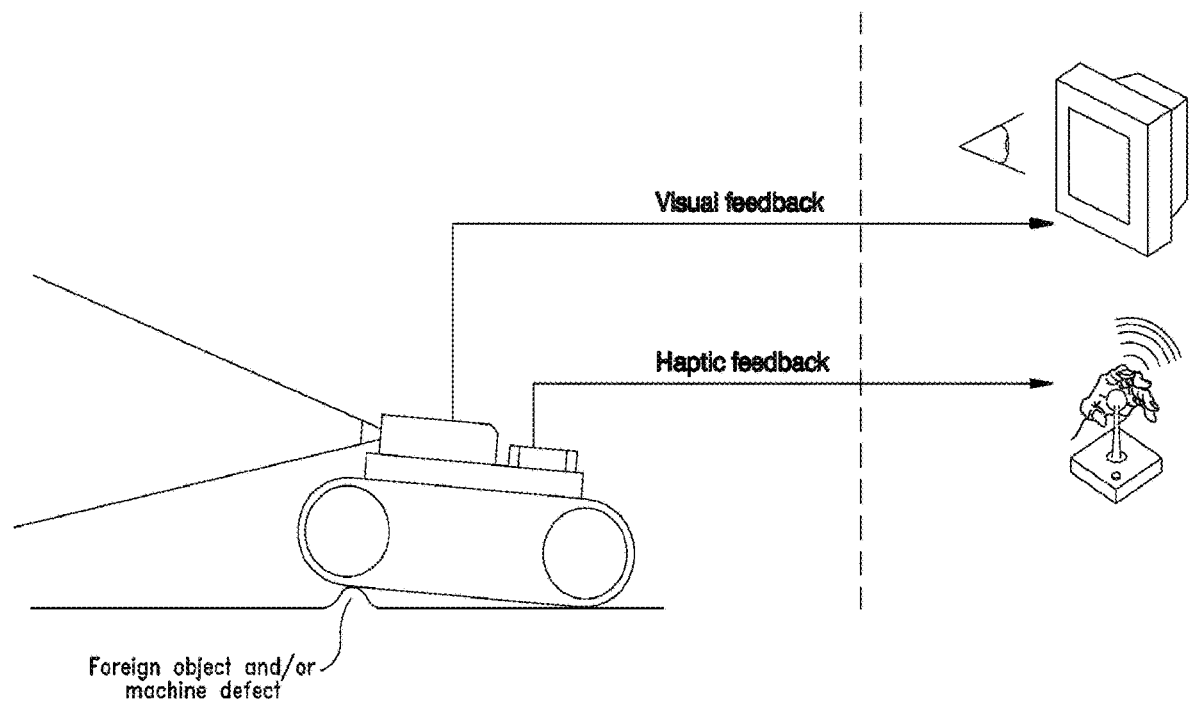
FIG. 14 shows exemplary inspection events that can trigger haptic feedback.

Air gap inspection crawlers 12 may carry sensors and devices to inspect and/or perform maintenance operations in the air gap. It is sometimes difficult for an air gap crawler operator to monitor the state of all such devices when performing an inspection. To aid the operator, some inspection events can trigger haptic feedback as shown in FIG. 14, such as a vibration through the joystick 122 or other crawler controller.

In some forms, haptic feedback can be the primary feedback means. In other forms, haptic feedback may supplement other feedback means. For example, visual feedback may be limited because the operator is looking at the crawler 12 or one of many display devices when an event occurs. In other cases audio feedback is limited because the environment can be noisy. Therefore, haptic feedback can be used instead of or as shown in FIG. 14 in addition to these other types of feedback.

In some forms the haptic feedback system can be designed such that different events result in different haptic feedback output. Some non-limiting examples include: a collision may cause the joystick 122 to move backward; slipping of the crawler (e.g. detected by two encoders in two different track modules disagreeing on the distance traveled) may cause a series of vibrations (short—short—short—delay—repeat); a loss of communication with an inspection sensor module (e.g. a wedge tapper) may cause a series of vibrations (short—long—short—long); and/or a detection of a problem by an inspection sensor module [e.g. an Electromagnetic Core Imperfection Detector (EL CID sensor)] may cause a series of vibrations (long—long—delay—repeat). Other events triggering haptic feedback could include without limitation an increased motor current for one of the track modules, an air gap height sensor detecting a narrowing of the air gap beyond a certain threshold.

Figure 16:
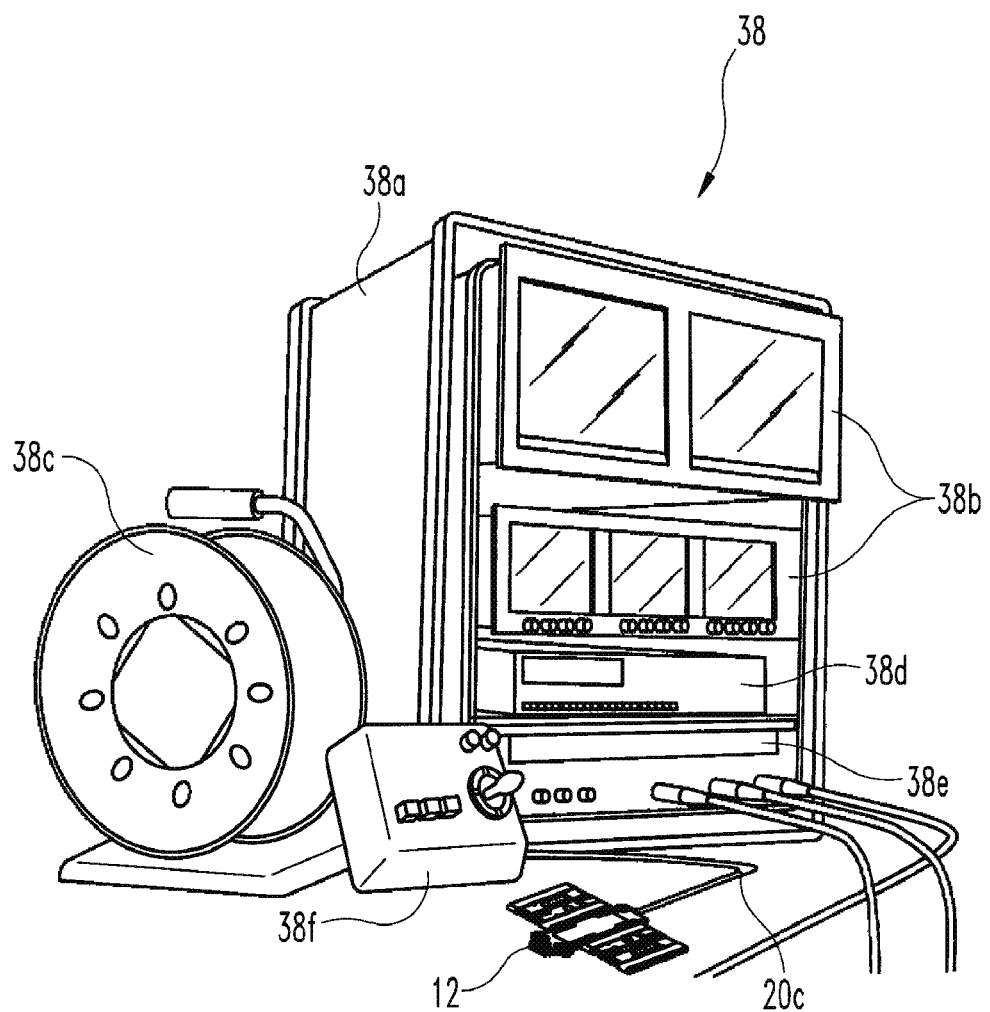
FIG. 16 shows an exemplary control module with associated equipment for operation of a crawler during inspection of a machine.

Referring now to FIG. 16, there is shown an exemplary embodiment of a control module 38 with associated equipment for facilitating operation and controlling crawler 12. The associated equipment can include a control cabinet 38a that includes several monitors 38b, a tether 38c for connecting the crawler 12 and the control module 38, central processing unit (CPU), a DVR 38d or other memory recording means in cabinet 38a, a data input/output device 38e, communication lines in cabinet 38a with a keyboard and a mouse and a control unit 38f that has a joystick to provide feedback to the operator, lighting and speed control for the crawler 12.

In one aspect, the present disclosure includes a system comprising a crawler operable for traversing through a confined space in a machine; one or more sensors coupled with the crawler, the one or more sensors operable for sensing information associated with the machine; a transmitter for transmitting information from the one or more sensors to at least one of a visual display and a retrievable memory storage; and a control system having haptic feedback capability to signal an occurrence of one of a plurality of predefined events.

In refined aspects the predefined event includes sensing a defect in the machine; the defect includes a foreign object located proximate the confined space; the one or more sensors include at least one of a video camera, an accelerometer based tilt sensor, and/or a proximity sensor; comprising a tether connected to the crawler; the crawler includes a main function module and one or more drive modules; the crawler includes modular capability to add a plurality of function modules and drive modules; the confined space is an air gap between a stator and a rotor of an electrical machine; the control system includes a manual control device with haptic feedback capability; haptic feedback is transmitted by the manual control device when one of the predefined events is sensed by the crawler; the plurality of predefined events include sensing a defect and/or sensing that a position or orientation of the crawler is different from that of a desired position or orientation; the control system generates an electronic result map of an inspected space within the machine to define discreet regions with information about defects and/or foreign objects located therein; comprising defining a new inspection schedule map based on the result map created during a previous inspection.

In another aspect, the present disclosure includes an inspection and repair system for a machine comprising a crawler configured to move within an air gap formed in the machine; one or more sensors associated with the crawler, the sensors operable for sensing defects within a sensing range of the crawler; a transmitter for transmitting information about the defect to at least one of a display and a retrievable memory; a control system for controlling movement and communication with the crawler; and a mapping system operable for creating an output map defined by discreet regions; wherein each of the discreet regions of the output map includes a status indicator based on sensed inspection data obtained by the crawler.

In refined aspects, the status indicator includes information related to a surface defect, a foreign object, a pass/fail index and/or other user defined criteria; the control system includes a tether line and/or wireless communication means operable with the crawler; an inspection path for the crawler is defined based on information from the status indicators of the output map; the crawler is controlled autonomously by the control system; movement of the crawler is at least partially controlled by a manual device; the manual device includes a haptic feedback system; the haptic feedback system transmits haptic feedback output when a defect is identified; the magnitude of the haptic feedback is proportional to a size of the defect; the haptic feedback system transmits haptic feedback output when a position or orientation of the crawler is not within a predefined limit of a desired position or orientation; the haptic feedback system includes a plurality of different signal definitions, each of the signal definitions corresponding to one of a plurality of different defect indicators and/or crawler orientation indicators; comprising a repair module associated with the crawler configured to perform a repair operation on the machine.

In yet another aspect, the present disclosure includes a method comprising moving a crawler within an air gap of an electrical machine; sensing a surface of the electrical machine during the moving; mapping the surface of the machine, wherein the mapping includes defining the surface as a plurality of discrete regions having a status indicator associated therewith; and displaying a map with the status indicators on a visual display.

In refined aspects, generating a new inspection schedule path for the crawler in response to the mapping of the electrical machine; the status indicator indicates one of a machine defect, foreign object, pass/fail, or other defined criteria; the sensing includes sensors with video, orientation and/or proximity capability; the sensing occurs on a stator and/or a rotor of the electrical machine; the moving includes input from a manual input device; comprising transmitting haptic feedback in response to the sensing of a defect in the electrical machine and/or a deviation from a desired position or orientation of the crawler; a transmission magnitude of haptic feedback is proportional to a size of the defect and/or a magnitude of the deviation; the transmission of haptic feedback includes a plurality of different signals to correspond with a plurality of predefined status indicators.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

What is claimed is:

1. A system comprising:
   a crawler operable for traversing through a confined space in a machine;
   one or more sensors coupled with the crawler, the one or more sensors structured and positioned to sense information associated with the machine;
   a transmitter for transmitting information from the one or more sensors to at least one of a visual display and a retrievable memory storage; and
   a control system having haptic feedback capability to signal an occurrence of one of a plurality of predefined events based upon the information sensed by the one or more sensors,
   wherein the plurality of predefined events include sensing a defect in the machine, and
   wherein the control system generates an electronic result map of an inspected space within the machine to define discreet regions, each of the discreet regions includes a status indicator selected, based on a defined criteria, from a plurality of different status indicators, the defined criteria including at least information indicative of at least one of defects or foreign objects are within the discreet region.

2. The system of claim 1, wherein the defect includes a foreign object located proximate the confined space.

3. The system of claim 1, wherein the one or more sensors include at least one of a video camera, an accelerometer bases tilt sensor, or a proximity sensor.

4. The system of claim 1 further comprising a tether connected to the crawler for transmitting electronic data to and from the crawler.

5. The system of claim 1, wherein the crawler includes a main function module and one or more drive modules.

6. The system of claim 1, wherein the crawler includes modular capability to add a plurality of function modules and drive modules.

7. The system of claim 1, wherein the confined space is an air gap positioned between a stator and a rotor of an electrical machine.

8. The system of claim 1, wherein the control system includes a manual control device with haptic feedback capability.

9. The system of claim 8, wherein haptic feedback is transmitted by the manual control device when one or the predefined events is sensed by the crawler.

10. The system of claim 9, wherein the plurality of predefined events include sensing at least one of a defect or that a position or orientation of the crawler is different from that of a desired position or orientation.

11. The system of claim 1 further comprising defining a new inspection schedule map based on the result map created during a previous inspection.

12. An inspection and repair system for a machine comprising:
    a crawler configured to move within an air gap formed in the machine;
    one or more sensors associated with the crawler, the sensors operable for sensing defects within a sensing range of the crawler;
    a transmitter for transmitting information about the defect to at least one of a display and a retrievable memory;
    a control system for controlling movement and communication with the crawler; and
    a mapping system with schedule information operable for creating an output map defined by discreet regions; wherein each of the discreet regions of the output map includes a status indicator selected from a plurality of different status indicators based on sensed inspection data obtained by the crawler, the plurality of different status indicators including status indicators indicative of whether at least one of defects or foreign objects are present within the discreet region.

13. The inspection and repair system of claim 12, wherein the status indicator includes information related to at least one of a surface defect, a foreign object, a pass/fail index or other user defined criteria.

14. The inspection and repair system of claim 12, wherein the control system includes at least one of a tether line or wireless communication means operable with the crawler.

15. The inspection and repair system of claim 12, wherein an inspection path for the crawler is defined based on information from the status indicators of the output map.

16. The inspection and repair system of claim 12, wherein the crawler is controlled autonomously by the control system.

17. The inspection and repair system of claim 12, wherein movement of the crawler is at least partially controlled by a manual device.

18. The inspection and repair system of claim 17, wherein the manual device included a haptic feedback system.

19. The inspection and repair system of claim 18, wherein the haptic feedback system transmits haptic feedback output when a defect is identified.

20. The inspection and repair system of claim 19, wherein the magnitude of the haptic feedback is proportional to a size of the defect.

21. The inspection and repair system of claim 18, wherein the haptic feedback system transmits haptic feedback output when a position or orientation of the crawler is not within a predefined limit of a desired position or orientation.

22. The inspection and repair system of claim 18, wherein the haptic feedback system includes a plurality of different signal definitions, each of the signal definitions corresponding to one of a plurality of different defect indicators or crawler orientation indicators.

23. The inspection and repair system of claim 12 further comprising a repair module associated with the crawler configured to perform a repair operation on the machine.

24. The inspection and repair system of claim 12 further comprising an inertial measurement unit operable with the crawler.

25. A method comprising:
    moving a crawler within an air gap of an electrical machine;
    sensing a surface of the electrical machine during the moving;
    mapping the surface of the machine, wherein the mapping includes defining the surface as a plurality of discrete regions with a status indicator and schedule information associated therewith, wherein the status indicator is selected from a plurality of different status indicators, and wherein at least some of the status indicators indicate a machine defect;
    displaying a map with the status indicators on a visual display; and
    transmitting haptic feedback in response to the sensing at least one of a defect in the electrical machine or a deviation from a desired position or orientation of the crawler.

26. The method of claim 25, generating a new inspection schedule path for the crawler in response to the mapping of the electrical machine.

27. The method of claim 25, wherein the status indicator indicates one of a machine defect, foreign object, pass/fail criteria, or other defined criteria.

28. The method of claim 25, wherein the sensing includes sensors with at least one of video, orientation or proximity capability.

29. The method of claim 25, wherein the sensing occurs on at least one of a stator or a rotor of the electrical machine.

30. The method of claim 25, wherein the moving includes input from a manual input device.

31. The method of claim 25, wherein a transmission magnitude of haptic feedback is proportional to at least one of a size of the defect or a magnitude of the deviation.

32. The method of claim 25, wherein the transmission of haptic feedback includes a plurality of different signals to correspond with a plurality of predefined status indicators.

* * * * *